(12) United States Patent
van Schravendijk et al.

(10) Patent No.: US 7,851,232 B2
(45) Date of Patent: Dec. 14, 2010

(54) UV TREATMENT FOR CARBON-CONTAINING LOW-K DIELECTRIC REPAIR IN SEMICONDUCTOR PROCESSING

(75) Inventors: Bart van Schravendijk, Sunnyvale, CA (US); William Crew, Portland, OR (US)

(73) Assignee: Novellus Systems, Inc., San Jose, CA (US)

(*) Notice: Subject to any disclaimer, the term of this patent is extended or adjusted under 35 U.S.C. 154(b) by 558 days.

(21) Appl. No.: 11/590,661

(22) Filed: Oct. 30, 2006

(65) Prior Publication Data

US 2010/0261349 A1    Oct. 14, 2010

(51) Int. Cl.
*H01L 21/00* (2006.01)

(52) U.S. Cl. .............................................. 438/4

(58) Field of Classification Search ............... 438/4
See application file for complete search history.

(56) References Cited

U.S. PATENT DOCUMENTS

| | | | |
|---|---|---|---|
| 3,983,385 A | 9/1976 | Troue | |
| 4,357,451 A | 11/1982 | McDaniel | |
| 4,391,663 A | 7/1983 | Hutter, III | |
| 4,563,589 A | 1/1986 | Scheffer | |
| 4,885,262 A | 12/1989 | Ting et al. | |
| 5,178,682 A | 1/1993 | Tsukamoto et al. | |
| 5,268,320 A | 12/1993 | Holler et al. | |
| 5,282,121 A | 1/1994 | Bornhorst et al. | |
| 5,504,042 A | 4/1996 | Cho et al. | |
| 5,582,880 A | 12/1996 | Mochizuki et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,840,600 A | 11/1998 | Yamazaki et al. | |

(Continued)

FOREIGN PATENT DOCUMENTS

JP    01-107519    4/1989

(Continued)

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner*—N Drew Richards
*Assistant Examiner*—Grant S Withers
(74) *Attorney, Agent, or Firm*—Weaver Austin Villeneuve & Sampson LLP

(57) ABSTRACT

A method for the ultraviolet (UV) treatment of carbon-containing low-k dielectric enables process-induced damage repair. The method is particularly applicable in the context of damascene processing. A method provides for forming a semiconductor device by depositing a carbon-containing low-k dielectric layer on a substrate and forming a trench in the low-k dielectric layer, the trench having sidewalls ending at a bottom. The trench is then exposed to UV radiation and, optionally a gas phase source of —$CH_3$ groups, to repair damage to the carbon-containing low-k material of the trench sidewalls and bottom caused by the trench formation process (generally etching, ashing, and wet or dry cleaning). A similar treatment, with or without the gas phase source of —$CH_3$ groups, may be applied to repair damage caused in a subsequent planarization operation.

22 Claims, 4 Drawing Sheets

U.S. PATENT DOCUMENTS

| | | |
|---|---|---|
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,150,272 A | 11/2000 | Liu et al. |
| 6,228,563 B1 | 5/2001 | Starov et al. |
| 6,254,689 B1 | 7/2001 | Meder |
| 6,268,288 B1 | 7/2001 | Hautala et al. |
| 6,270,846 B1 | 8/2001 | Brinker et al. |
| 6,271,273 B1 | 8/2001 | You et al. |
| 6,329,017 B1 | 12/2001 | Liu et al. |
| 6,340,628 B1 | 1/2002 | Van Cleemput et al. |
| 6,365,266 B1 | 4/2002 | MacDougall et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,420,441 B1 | 7/2002 | Allen et al. |
| 6,444,715 B1 | 9/2002 | Mukherjee et al. |
| 6,467,491 B1 | 10/2002 | Sugiura et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,531,193 B2 | 3/2003 | Fonash et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,576,300 B1 | 6/2003 | Berry et al. |
| 6,596,654 B1 | 7/2003 | Bayman et al. |
| 6,635,575 B1 | 10/2003 | Xia et al. |
| 6,644,786 B1 | 11/2003 | Lebens |
| 6,677,251 B1 | 1/2004 | Lu et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,770,866 B2 | 8/2004 | Retschke et al. |
| 6,797,643 B2 | 9/2004 | Rocha-Alvarez et al. |
| 6,805,801 B1 | 10/2004 | Humayun et al. |
| 6,812,043 B2 | 11/2004 | Bao et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,884,738 B2 | 4/2005 | Asai et al. |
| 6,921,727 B2 | 7/2005 | Chiang et al. |
| 6,958,301 B2 | 10/2005 | Kim et al. |
| 7,005,390 B2 | 2/2006 | Ramachandrarao et al. |
| 7,018,918 B2 | 3/2006 | Kloster et al. |
| 7,030,041 B2 | 4/2006 | Li et al. |
| 7,094,713 B1 | 8/2006 | Niu et al. |
| 7,132,334 B2 | 11/2006 | Lin |
| 7,148,155 B1 | 12/2006 | Tarafdar et al. |
| 7,166,531 B1 * | 1/2007 | van den Hoek et al. ...... 438/623 |
| 7,176,144 B1 | 2/2007 | Wang et al. |
| 7,208,389 B1 | 4/2007 | Tipton et al. |
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,265,061 B1 | 9/2007 | Cho et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,419,772 B2 | 9/2008 | Watkins et al. |
| 7,481,882 B2 | 1/2009 | Won et al. |
| 7,504,663 B2 | 3/2009 | Yamazaki et al. |
| 7,510,982 B1 | 3/2009 | Draeger et al. |
| 7,611,757 B1 | 11/2009 | Bandyopadhyay et al. |
| 7,622,162 B1 | 11/2009 | van Schravendijk et al. |
| 2001/0001501 A1 | 5/2001 | Lee et al. |
| 2001/0014512 A1 | 8/2001 | Lyons et al. |
| 2002/0001973 A1 | 1/2002 | Wu et al. |
| 2002/0016085 A1 | 2/2002 | Huang et al. |
| 2002/0034626 A1 | 3/2002 | Liu et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0172766 A1 | 11/2002 | Laxman et al. |
| 2002/0195683 A1 | 12/2002 | Kim et al. |
| 2003/0013280 A1 | 1/2003 | Yamanaka |
| 2003/0064607 A1 | 4/2003 | Leu et al. |
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0228770 A1 | 12/2003 | Lee et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0069410 A1 | 4/2004 | Moghadam et al. |
| 2004/0082163 A1 | 4/2004 | Mori et al. |
| 2004/0096586 A1 | 5/2004 | Schluberg et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0166240 A1 | 8/2004 | Rhee et al. |
| 2004/0185679 A1 | 9/2004 | Ott et al. |
| 2004/0224496 A1 | 11/2004 | Cui et al. |
| 2005/0025892 A1 | 2/2005 | Satoh et al. |
| 2005/0064726 A1 | 3/2005 | Reid et al. |
| 2005/0112282 A1 | 5/2005 | Gordon et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 * | 9/2005 | Lu et al. ..................... 438/623 |
| 2005/0260357 A1 | 11/2005 | Olsen et al. |
| 2005/0260420 A1 | 11/2005 | Collins et al. |
| 2005/0272220 A1 | 12/2005 | Waldfried et al. |
| 2006/0024976 A1 * | 2/2006 | Waldfried et al. ........... 438/778 |
| 2006/0027929 A1 | 2/2006 | Cooney et al. |
| 2006/0105106 A1 | 5/2006 | Balseanu et al. |
| 2006/0118817 A1 | 6/2006 | Haisma |
| 2006/0145304 A1 | 7/2006 | Boyanov et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0105292 A1 | 5/2007 | Chen et al. |
| 2007/0132054 A1 | 6/2007 | Arghavani et al. |
| 2007/0134907 A1 | 6/2007 | Ikeda et al. |
| 2007/0196011 A1 | 8/2007 | Cox et al. |
| 2007/0222081 A1 * | 9/2007 | Chen et al. .................. 257/773 |
| 2007/0224824 A1 * | 9/2007 | Chen et al. .................. 438/700 |
| 2007/0275569 A1 | 11/2007 | Moghadam et al. |
| 2007/0281497 A1 | 12/2007 | Liu et al. |

| | | |
|---|---|---|
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0132055 A1 | 6/2008 | Nguyen et al. |
| 2008/0199977 A1 | 8/2008 | Weigel et al. |
| 2008/0286697 A1 | 11/2008 | Verhaverbeke et al. |
| 2008/0305600 A1 | 12/2008 | Liao et al. |
| 2009/0017640 A1 | 1/2009 | Huh et al. |
| 2009/0039475 A1 | 2/2009 | Shioya |

FOREIGN PATENT DOCUMENTS

| | | |
|---|---|---|
| JP | 09-306892 | 11/1997 |
| JP | 63-307740 | 12/2008 |
| KR | 2000-0043888 | 7/2000 |
| WO | 2006/104583 | 10/2006 |
| WO | 2006/127463 | 11/2006 |
| WO | 2007/043206 | 4/2007 |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Jan, C.H., et al, 90NM Generation, 300mm Wafer Low k ILD/Cu Interconnect Technology, 2003 IEEE Interconnect Technology Conference.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Tipton et al., "Method of Porogen Removal From Porous Low-K Films Using UV Radiation", U.S. Appl. No. 10/672,311, filed Sep. 26, 2003, Office Action dated Sep. 7, 2004.

Tipton et al., "Method of Porogen Removal From Porous Low-K Films Using UV Radiation", U.S. Appl. No. 10/672,311, filed Sep. 26, 2003, Office Action dated Dec. 28, 2004.

Bandyopadhyay et al., "Method to Improve Mechanical Strength of Low-K Dielectric Film Using Modulated UV Exposure", U.S. Appl. No. 10/825,888, filed Apr. 16, 2004.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Niu et al., "Methods for Improving the Cracking Resistance of Low-K Dielectric Materials", U.S. Appl. No. 10/860,340, Office Action dated Mar. 2, 2005.

Niu et al., "Methods for Improving the Cracking Resistance of Low-K Dielectric Materials", U.S. Appl. No. 10/860,340, Final Office Action dated Jun. 13, 2005.

Varadarajan et al., "Tensile Dielectric Films Using UV Curing", U.S. Appl. No. 10/972,084, filed Oct. 22, 2004.

Draeger et al., "Creation of Porosity in Low-K Films by Photo-Disassociation of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Dec. 20, 2005, from U.S. Appl. No. 10/672,311.

U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

Shrinivasan et al., "Multi-Station Sequential Curing of Dielectric Films," Novellus Systems, Inc., U.S. Appl. No. 11/688,695, filed Mar. 20, 2007, pp. 1-36.

Schravendijk, et al., "UV Treatment of STI Films for Stress," Novellus Systems, Inc., U.S. Appl. No. 11/811,048, filed Jun. 7, 2007.

Arghavani et al., Strain Engineering in Non-Volatile Memories, Reed Business Information, 2007, six pages.

Notice of Allowance and Fee Due mailed May 22, 2006, from U.S. Appl. No. 10/672,311.

Allowed Claims from U.S. Appl. No. 10/672,311.

Notice of Allowance and Fee Due mailed Apr. 4, 2007, from U.S. Appl. No. 10/825,888.

Allowed Claims from U.S. Appl. No. 10/825,888.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S. Appl. No. 10/800,377.

Allowed Claims from U.S. Appl. No. 10/800,377, filed Mar. 11, 2004, Claims filed Sep. 13, 2006.

U.S. Office Action mailed Nov. 28, 2007, from U.S. Appl. No. 10/807,680.

R.J. Lewis, Sr., Hawley's Condensed Chemical Dictionary, 12th Edition, Van Nostrad Reinhold Co., New York, 1993 (no month), excerpts pp. 916-918 & 1123-1124.

Notice of Allowance and Fee Due mailed Dec. 20, 2005, from U.S. Appl. No. 10/860,340.

Allowed Claims from U.S. Appl. No. 10/860,340.

U.S. Office Action mailed Dec. 12, 2007, from U.S. Appl. No. 11/146,456.

U.S. Office Action mailed Oct. 3, 2007, from U.S. Appl. No. 11/115,576.

Shaviv et al., "UV Treatment to Improve Integrity and Performance of Front End Dielectrics," Novellus Systems, Inc., U.S. Appl. No. 11/622,409, filed Jan. 11, 2007.

Shrinivassan et al., "Multi-Station Sequential Curing of Dielectric Films," Novellus Systems, Inc., U.S. Appl. No. 11/688,695, filed Mar. 20, 2007.

Varadarajan et al., "A Cascaded Cure Approach to Fabricate Highly Tensile Silicon Nitride Films," Novellus Systems, Inc., U.S. Appl. No. 11/897,838, filed Aug. 31, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S. Appl. No. 11/622,423.

Bhadri Varadarajan et al., "Development of High Stress SiN Films for Use with Strained Silicon Technologies"; Proc. 68$^{th}$ Symp. On Semiconductors and IC Tech.; Kyoto 2005.

U.S. Appl. No. 11/824,049, Notice of Allowance mailed Jun. 22, 2009.

U.S. Appl. No. 11/824,049, Allowed Claims.

U.S. Appl. No. 11/696,102, Office Action mailed Jul. 1, 2009.

Yu, J.J. et al., "UV Annealing of Ultrathin Tantalum Oxide Films", Applied Surface Science, V 186 (2002), 57-63.

U.S. Appl. No. 11/811,048, Notice Of Allowance mailed Aug. 17, 2009.

U.S. Appl. No. 11/811,048, Allowed Claims.

U.S. Appl. No. 11/369,311, Office Action mailed Aug. 20, 2009.

U.S. Appl. No. 11/608,056, Office Action mailed Aug. 20, 2009.

Varadarajan et al., "Tensile dielectric films using UV curing", U.S. Appl. No. 10/972,084, filed Oct. 22, 2004.

P. Morin et al., "Tensile contact etch stop layer for nMOS performance enhancement: influence of the film morphology", ECS meeting, May 2005.

Takagi et al., "High Rate Deposition of a-Si:H and a-SiN$_x$:H by VHF PECVD", Vacuum, 51, 1998.

Smith, D.L et al., "Mechanism of SiN$_3$-SiH$_4$ Llasma", J. Electrochem. Soc., vol. 137 (2) 1990.

Nagayoshi et al., "Residual Stress of a Si$_{1-x}$N$_x$; H Films Prepared by Afterglow Plasma Chemical Vapor Deposition Technique", Jpn. J. Appl. Phys. vol. 31 (1992) pp. L867-L869 Part 2, No. 7A, Jul. 1, 1992.

Varadarajan et al., "Use of VHF RF plasma to deposit high tensile stress films with improved film properties for use in strained silicon technology", U.S. Appl. No. 11/975,473, filed Oct. 18, 2007.

U.S. Appl. No. 11/975,473, Office Action mailed Oct. 28, 2008.

U.S. Appl. No. 11/975,473, Office Action mailed Mar. 23, 2009.

Jiang et al., "Tensile dielectric films using UV curing", U.S. Appl. No. 11/899,683, filed Sep. 7, 2007.

U.S. Appl. No. 11/899,683, Office Action mailed May 29, 2009.

U.S. Appl. No. 11/519,445, Office Action mailed Aug. 26, 2009.

U.S. Appl. No. 11/622,409, Office Action mailed Jul. 1, 2009.

Haverkamp et al., "Enhancing adhesion of cap layer films", U.S. Appl. No. 11/731,581, filed Mar. 30, 2007.

U.S. Appl. No. 11/731,581, Office Action mailed Jun. 1, 2009.

Schulberg et al., "System for Deposition of Mesoporous Materials," U.S. Appl. No. 10/295,965, filed Nov. 15, 2002, 64 Pages.

U.S. Office Action mailed Apr. 3, 2008, from U.S. Appl. No. 10/982,654.

U.S. Office Action mailed Sep. 19, 2008, from U.S. Appl. No. 11/824,049.

U.S. Final Office Action mailed Jul. 10, 2008, from U.S. Appl. No. 10/807,680.

U.S. Final Office Action mailed Jul. 25, 2008, from U.S. Appl. No. 11/146,456.

U.S. Final Office Action mailed Jul. 9, 2008, from U.S. Appl. No. 10/982,654.

U.S. Office Action mailed May 14, 2008, from U.S. Appl. No. 11/519,445.

U.S. Final Office Action mailed May 2, 2008, from U.S. Appl. No. 11/115,576.

U.S. Office Action mailed Oct. 17, 2008, from U.S. Appl. No. 11/115,576.

U.S. Office Action mailed Jul. 23, 2008, from U.S. Appl. No. 11/622,423.

U.S. Appl. No. 11/811,048, Office Action mailed Mar. 19, 2009.

Rodriquez, J.A. et al., "Evolution of the mechanical stress on PECVD silicon oxide films under thermal processing", Journal of Materials Science Letters 19, 2000, pp. 1399-1401.

U.S. Appl. No. 11/606,340, Office Action mailed Feb. 5, 2009.

U.S. Appl. No. 11/824,049, Office Action mailed Mar. 19, 2009.

U.S. Appl. No. 10/982,654, Office Action mailed Dec. 4, 2008.

U.S. Appl. No. 11/519,445, Office Action mailed Dec. 10, 2008.

U.S. Appl. No. 10/972,084, Office Action mailed Dec. 30, 2008.

U.S. Appl. No. 11/115,576, Office Action mailed Apr. 22, 2009.

Draeger et al., "Creation of Porosity in Low-K Films by Photo-Disassociation of Imbedded Nanoparticles," U.S. Appl. No. 12/369,384, filed Feb. 11, 2009.

U.S. Appl. No. 11/688,695, Office Action mailed Jun. 11, 2009.

U.S. Appl. No. 11/975,473, Office Action mailed Mar. 25, 2010.

Takagi et al., "High Rate Deposition of a-SiN$_x$:H by VHF PECVD", Mat. Res. Soc. Symp. Proc. vol. 467, 1997, Materials Research Society.

U.S. Appl. No. 12/726,263, "Apparatus for UV damage repair of low K films prior to copper barrier deposition", van Schravendijk et al., filed Mar. 17, 2010.

U.S. Appl. No. 11/115,576, Office Action mailed Apr. 15, 2010.

U.S. Appl. No. 11/519,445, Notice of Allowance mailed Apr. 21, 2010.

U.S. Appl. No. 11/519,445, Allowed Claims.

U.S. Appl. No. 11/561,834, Office Action mailed May 21, 2010.

U.S. Appl. No. 12/646,830, "UV and Reducing Treatment for K Recovery and Surface Clean in Semiconductor Processing", Varadarajan, Bhadri et al., filed Dec. 23, 2009.

U.S. Appl. No. 11/115,576, Office Action mailed Oct. 1, 2009.

U.S. Appl. No. 11/975,473, Office Action mailed Oct. 9, 2009.

Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.

U.S. Appl. No. 11/622,409, Office Action mailed Nov. 5, 2009.

U.S. Appl. No. 11/519,445, Office Action mailed Nov. 4, 2009.

U.S. Appl. No. 10/972,084, Office Action mailed Nov. 27, 2009.

Haverkamp, et al., "Multi-Station Sequential Curing of Dielectric Films," Novellus Systems, Inc., U.S. Appl. No. 11/977,792, filed Oct. 25, 2007.

Haverkamp, et al., "Progressive UV Cure," Novellus Systems, Inc., U.S. Appl. No. 12/210,060, filed Sep. 12, 2008.

U.S. Appl. No. 11/696,102, Final Office Action mailed Dec. 22, 2009.

U.S. Appl. No. 11/369,311, Office Action mailed Jan. 5, 2010.

U.S. Appl. No. 11/688,695, Final Office Action mailed Dec. 31, 2009.

U.S. Appl. No. 11/656,661, Office Action mailed Jan. 22, 2010.

U.S. Appl. No. 11/731,581, Office Action mailed Feb. 4, 2010.

U.S. Appl. No. 11/899,683, Office Action mailed Feb. 8, 2010.

Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.

U.S. Appl. No. 11/977,792, Office Action mailed Mar. 9, 2010.

Chaabouni, H. et al., "Porous SiOCH Ultra Low-K recovery treatments after direct CMP process", Advanced Metallization Conference, Sep. 2008.

Chaabouni, H. et al., "Sidewall restoration of porous ultra low-$k$ dielectrics for sub-45 nm technology nodes", Microelectronic Engineering 84 (2007).

Huang, H. et al., "O2 Plasma Damage and Dielectric Recoveries to Patterned CDO Low-k Dielectrics", Advanced Metallization Conference, Sep. 2008.

U.S. Appl. No. 11/608,056, Office Action mailed Mar. 23, 2010.

\* cited by examiner

UV TREATMENT FOR CARBON-CONTAINING LOW-K DIELECTRIC REPAIR IN SEMICONDUCTOR PROCESSING

BACKGROUND OF THE INVENTION

The invention relates to low dielectric constant layers in semiconductor processing for use in various applications. More specifically, the invention relates to the UV treatment for repair of process-induced damage of low dielectric constant dielectric materials in, for example, damascene processing.

Ultrafine feature sizes and high performance requirements have necessitated the integration of low dielectric constant (low-k) insulating materials, that are mechanically weaker than previous generation materials, into semiconductor devices. The inherently weak nature of the low-k dielectric material can pose significant challenges for downstream electronic-packaging processes and material compatibility.

Low-k materials are, by definition, those semiconductor-grade insulating materials that have a dielectric constant ("k") lower than that of $SiO_2$, i.e., 3.9. Various types of low-k materials can have dielectric constants ranging from about 3.8-3.6 (e.g., fluorosilicate glass (FSG)), to less than about 3.2 (e.g., (carbon doped oxide (CDO)), to as low as 2.2 (e.g., spin-on glass (SOG)) or even lower, and encompass low-k dielectrics referred to as "ultra low-k" (ULK) and "extreme ultra low-k" (ELK). In many CDO carbon-containing low-k implementations, such as are described herein, suitable carbon-containing low-k materials have a dielectric constant of about 2.7 or lower. To further reduce the size of devices on integrated circuits, it has become necessary to use conductive materials having low resistivity and insulators having low dielectric constants to reduce the capacitive coupling between adjacent metal lines. Low-k materials are being integrated into the devices to improve device performance and allow for device scaling.

Low-k materials are less dense than standard insulating materials such as $SiO_2$. This introduces a host of process integration and material compatibility difficulties. The balance between maintaining the film's integrity and integrating it properly and performing the necessary stripping, cleaning, and conditioning gets increasingly precarious. Patterning processes (etching, stripping, deposition, and cleaning) can also have a drastic impact on the integrity of carbon-containing low-k materials, in particular SiOC-based low-k materials.

The properties that give carbon-containing low-k dielectric materials their desirable low dielectric constants are the very same properties that are leading to significant integration challenges. Carbon-containing low-k materials achieve lower dielectric constants through the incorporation of non-polar covalent bonds (e.g., from the addition of carbon) and the introduction of porosity to decrease film density. Introducing porosity or the incorporation of terminal bonds, such as Si—$CH_3$, breaks the continuity of the rigid Si—O—Si lattice of traditional oxides, yielding a lower dielectric constant film that is both mechanically and chemically weaker. Because of the mechanical weakness, carbon-containing low-k films are susceptible to kinetic plasma damage that can undesirably densify the film and thus increase the film's effective k value.

Furthermore, chemical plasmas can modify carbon-containing low-k films where bonds such as Si—$CH_3$ are readily broken. The susceptibility of carbon-containing low-k materials to plasma modification poses a serious integration challenge since plasma processes are routinely used to etch, clean, and deposit films in the manufacturing of a semiconductor device. Moreover, in damascene processing, prior to metal barrier deposition, process induced carbon-containing low-k dielectric damage can be incurred from etch, dry resist strip, wet cleaning and dry cleaning. Carbon-containing low-k materials are also susceptible to the intercalation of plasma species, residues, solvents, moisture, and precursor molecules that can either adsorb into, outgas from, or chemically modify the film.

Damage to the carbon-containing low-k dielectric material on the sidewalls of the via trenches or in the inter-layer dielectric (ILD) regions during copper (Cu) damascene processing can compromise the integrity of dielectric spacing, leading to increased leakage, higher capacitance, and reduced performance and reliability. The damaged low-k layers can absorb moisture which remains trapped in the dielectric. This can oxidize the barrier material leading to Cu diffusion. Damage of the low-k dielectric material is linked to the loss of methyl groups ($CH_3$) in the film during processing. Thus, dielectric repair to prevent the unwanted absorption of moisture is important.

Carbon depletion occurs when, for example, a Si—$CH_3$ bond is broken leaving a silicon dangling bond. Reaction with absorbed water results in the formation of silanol (Si—OH) groups. Slurry from chemical mechanical polishing (CMP) can also chemically remove carbon groups on the surface of the low-k dielectric film. Again, a reaction with the water present in the CMP slurry results in the formation of highly polarizable silanol (Si—OH) groups, which leads to an increase in k value for the damaged portion of the film, increasing the effective k value of the dielectric significantly.

Because of this, semiconductor manufacturers have developed methods to eliminate carbon depletion or replenish (repair) the depleted carbon. One method is the use of chemicals called "Toughening Agents" (TA) to repair carbon depletion damage. Another method is to use sacrificial capping layers to protect the low-k films from carbon depletion. However, both methods narrow the required process window and lead to higher manufacturing costs. Furthermore, an increase k effective may still result. Thus, improved methods for low-k dielectric repair in semiconductor processing are needed.

SUMMARY OF THE INVENTION

The present invention provides a method for the ultraviolet (UV) treatment of carbon-containing low-k dielectric, for example, but not limited to carbon-doped oxide (CDO), for the repair of process-induced damage. Inventive methods provide for treatment of a damaged low-k dielectric on a semiconductor substrate with UV radiation to repair processing induced damage. The method is particularly applicable in the context of damascene processing.

In one aspect, the invention relates to a method of forming a semiconductor device by depositing a carbon-containing low-k dielectric (e.g., CDO) layer on a substrate and forming a via and trench in the low-k dielectric layer, the trench having sidewalls ending at a bottom. The trench is then exposed to UV radiation to repair damage (e.g., dangling bonds or highly strained bonds, e.g., Si—O—Si or Si—$CH_2$—Si, caused by removal of organic (generally —$CH_3$) groups) to the low-k material of the trench sidewalls and bottom caused by the trench formation process (generally etching, ashing, and wet or dry cleaning)). The repaired damascene trench can then be filled with a conductive material, particularly a diffusion barrier layer followed by copper. The top surface of the semiconductor device can then be planarized, generally by chemical mechanical polishing (CMP). Post-planarization UV repair of planaraization-induced dielectric damage may also be conducted.

The UV exposure may be conducted in vacuum. While the invention is not limited to this theory of operation, it is believed that the UV exposure of the damaged dielectric surface according to this aspect of the invention cross-links the surface Si groups to fill gaps from the departed methyl (—$CH_3$) groups.

In other embodiments, the UV exposure may be conducted in a partial pressure of a reactive gas that participates in dielectric repair. An appropriate gas will include a gas phase source of methyl (—$CH_3$) groups during the UV exposure. Exposure time should be limited in order to prevent oxidation of or the stripping of methyl groups from the dielectric. In general, the dose time should be for no more than 10 seconds and/or result in a penetration of no more than four to five monolayers of the dielectric. A preferred dose time is about one to two seconds. Suitable gas phase reactants include, preferably, organo-silanes, -silazanes, and -siloxanes, for example, dichlorodimethylsilane (DCDMS), chlorotrimethylsilane (CTMS), hexamethyldisilazane (HMDS), hexamethyldisiloxane (HMDSO), tetravinyltetramethylcyclotetrasiloxane (TVTMCTS)). Other suitable gas phase reactants include acetaldehyde; alkanes, for example methane and ethane; alkenes, for example ethylene; and alkynes, for example acetylene, may also be used. —H and —O groups may also participate in suitable repair reactions. In that case, —H and —O may be provided in one or more gas phase reactants or may evolve from the film. The gas phase may also include inert carriers such as He, Ar, Ne, $N_2$, etc.

While the invention is not limited to this theory of operation, it is believed that damage sites, including dangling Si bonds and/or highly strained bonds (e.g., Si—O—Si or Si—$CH_2$—Si) in the carbon-containing dielectric film are satisfied with a methyl group from methyl-containing molecules of the gas phase source of methyl (—$CH_3$) groups in a reaction induced by the activation provided by UV radiation, thereby accomplishing low-k dielectric repair without substantial alteration of dielectric properties. In some instances, active methyl (—$CH_3$) groups may be generated by dissociation of methyl-containing molecules of the gas phase source of —$CH_3$ groups by the UV radiation. Alternatively, methyl groups in methyl-containing molecules in the gas phase source of —$CH_3$ groups can react with damage sites in the film. The reaction of the activated methyl groups with the damaged area of the film when the activation energy is lowered by the UV radiation reduces the energy of film, rendering it more stable.

Anything other than a carbon group reacting with a damage site on the surface of the dielectric will produce a higher k than the original carbon-containing low-k film. However, in instances where a minimal k value of the dielectric is not required, this rise in effective k resulting from non-carbon-containing repair (e.g., UV exposure alone) may be acceptable.

Another aspect of the invention relates to post-planarization (e.g., CMP) carbon-containing low-k dielectric damage repair arising in damascene processing. According to this aspect, following planarization by CMP, Si—OH (silanol) bonds (formed by removal of organic (generally —$CH_3$) groups by CMP slurry and processing and reaction of water in the slurry with resulting dangling Si-bonds), or other film damage (e.g., highly strained bonds) are repaired by exposing the surface to UV radiation. As described above, it is believed that the UV exposure cleaves the silanol bonds (Si—OH) and cross-links the film Si groups to fill gaps from the departed methyl (—$CH_3$) groups. The result is a densified surface layer. This UV exposure may optionally also be conducted in the presence of a gas phase source of methyl (—$CH_3$) groups such that the surface low-k dielectric repair is achieved without substantial alteration of dielectric properties, as described above.

The invention may also be more generally applicable in other semiconductor processing contexts. For example, a method of forming a semiconductor device, may involve depositing a carbon-containing low-k dielectric layer on a substrate, conducting a semiconductor processing operation that damages the low-k dielectric layer, and exposing the low-k dielectric layer to UV radiation such that processing-induced low-k dielectric damage to the dielectric is repaired.

These and other features and advantages of the present invention will be described in more detail below with reference to the associated drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
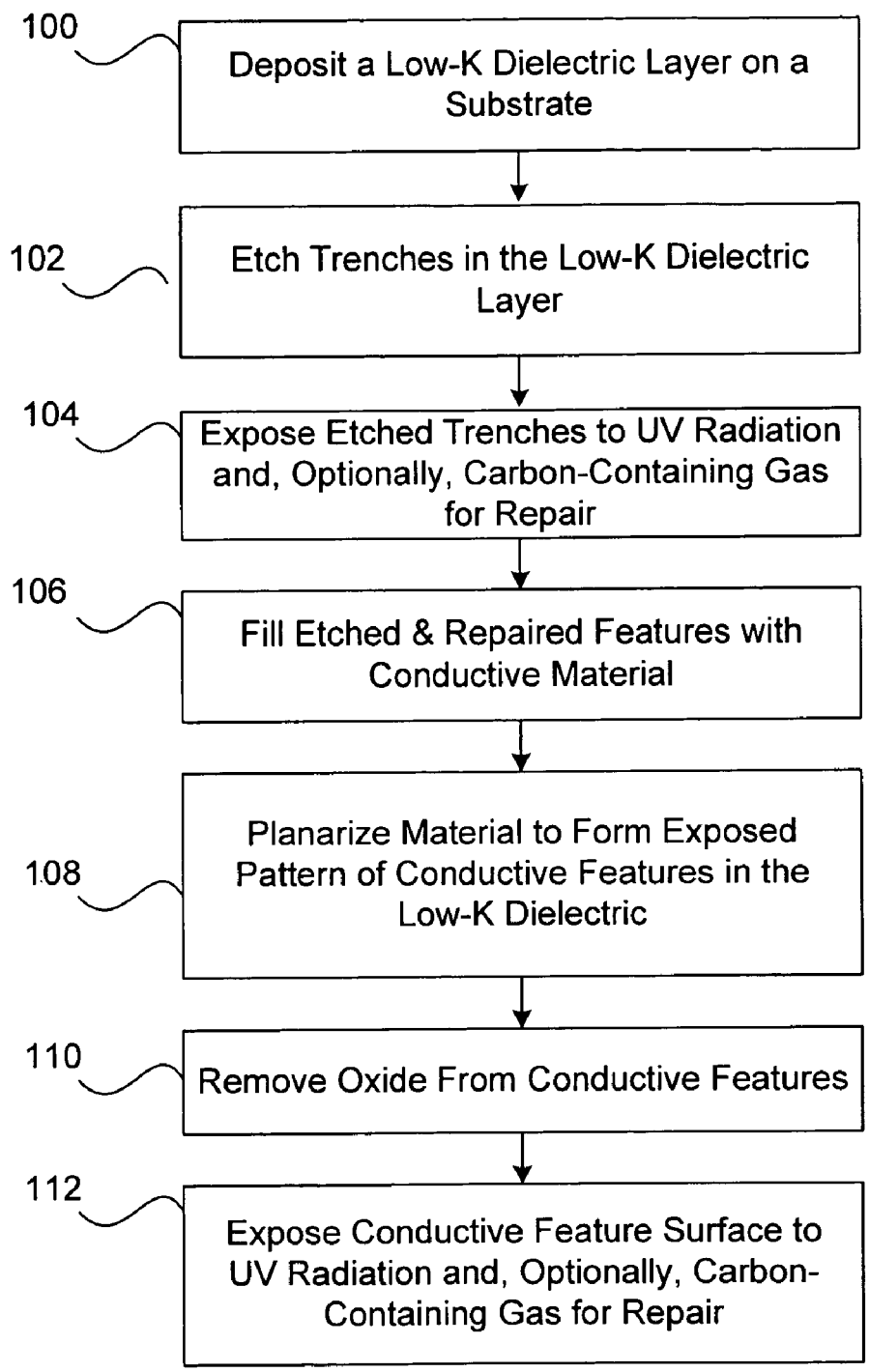
FIG. 1 is a process flow chart depicting a method in accordance with an embodiment of the invention.

Embodiments of the present invention are described herein in the context of a UV treatment for carbon-containing low-k dielectric repair in damascene processing. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

As noted above, the present invention provides a method for the ultraviolet (UV) treatment of carbon-containing low-k dielectric for the repair of process-induced damage. Applicable carbon containing dielectrics typically have SiO-based backbones doped with carbon, in particular CDO (for example, those formed from octamethyl cyclotetrasiloxane (OMCTS), tetramethylcyclotetrasiloxane (TMCTS), dimethyldimethoxysilane (DMDMOS), and diethoxymethylsilane (DEMS) and other known CDO precursors), but may also include hybrid polymers incorporating both C, Si and O in the backbone. Inventive methods provide for treatment of a damaged carbon-containing low-k dielectric on a semiconductor substrate with UV radiation to repair processing induced damage. The method is particularly applicable in the context of damascene processing.

In one aspect, the invention relates to a method of forming a semiconductor device by depositing a carbon-containing low-k dielectric layer on a substrate and forming a via and trench in the low-k dielectric layer, the trench having sidewalls ending at a bottom. The trench is then exposed to UV radiation to repair process induced low-k dielectric damage (e.g., dangling bonds or highly strained bonds, e.g., Si—O—Si or Si—$CH_2$—Si, caused by removal of organic (generally —$CH_3$) groups) to the low-k material of the trench sidewalls and bottom caused by etch, dry resist strip, wet cleaning and dry cleaning, for example, involved in the trench formation process. The repaired damascene trench can then be filled with a conductive material, particularly a metal diffusion barrier followed by copper. The top surface of the semiconductor device can then be planarized, generally by chemical mechanical polishing (CMP). Post-planarization UV repair of planaraization-induced dielectric damage may also be conducted.

FIG. 1 is a process flow chart depicting operations in a method in accordance with an embodiment of this invention. A generalized version of a dual damascene technique will be described below with reference to FIGS. 2A through 2D, which depict a partially formed semiconductor device during various stages of this process. However, the invention is not intended to be limited to the use of a dual damascene technique as the invention may be used with other techniques.

Referring now to FIG. 1, a carbon containing low-k dielectric layer is deposited on a substrate at 100. Patterns of conductive features are formed in the dielectric layer, generally by etching, at 102. Etching generally results in damage to the pattern edges, generally trench sidewalls and bottoms, as described above. Other process operations, such as dry resist strip, wet cleaning and dry cleaning, can also cause or contribute to low-k dielectric damage. The conductive features are typically, though not necessarily, metal lines and vias. In one example, they are the interconnects of a metallization layer that is formed from copper. As is known to those of skill in the art, various techniques may be employed to form such layers.

The etched trenches are then exposed to ultraviolet (UV) radiation at 104. The UV exposure may be conducted in vacuum. While the invention is not limited to any particular theory of operation, it is believed that the UV exposure of the damaged dielectric surface according to this aspect of the invention cross-links the surface Si groups to fill gaps from the departed methyl (—$CH_3$) groups.

In other embodiments, the UV exposure may be conducted in a partial pressure of a reactive gas that participates in dielectric repair. An appropriate gas will have a gas phase source of methyl (—$CH_3$) groups during the IN exposure. Exposure time should be limited in order to prevent oxidation of or the stripping of methyl groups from the dielectric. In general, the dose time should be for no more than 10 seconds and/or result in a penetration of no more than four to five monolayers of the dielectric. A preferred dose time is about one to two seconds. Suitable gas phase reactants include, preferably, organo-silanes, -silazanes, and -siloxanes, for example, dichlorodimethylsilane (DCDMS), chlorotrimethylsilane (CTMS), hexamethyldisilazane (HMDS), hexamethyldisiloxane (HMDSO), tetravinyltetramethylcyclotetrasiloxane (TVTMCTS)). Other suitable gas phase reactants include acetaldehyde; alkanes, for example methane and ethane; alkenes, for example ethylene; and alkynes, for example acetylene, may also be used. —H and —O groups may also participate in suitable repair reactions. In that case, —H and —O may be provided in one or more gas phase reactants or may evolve from the film. The gas phase may also include inert carriers such as He, Ar, Ne, $N_2$, etc.

While the invention is not limited to this theory of operation, it is believed that damage sites, including dangling Si bonds and/or highly strained bonds (e.g., Si—O—Si or Si—$CH_2$—Si) in the carbon-containing low-k dielectric film are satisfied with a methyl group from the gas phase source of —$CH_3$ groups in a reaction induced by the activation provided by UV radiation, thereby accomplishing low-k dielectric repair without substantial alteration of dielectric properties. In some instances, active methyl (—$CH_3$) groups may be generated by dissociation of methyl-containing molecules in the gas phase source of —$CH_3$ groups by the UV radiation. Alternatively, methyl groups in methyl-containing molecules in the gas phase source of —$CH_3$ groups can react with damage sites in the film. The reaction of activated methyl with the damage surface site can occur when UV radiation excites electrons into anti-bonding states, lowering the thermal activation energy of the reaction. This renders the film more stable.

Anything other than a carbon group reacting with a damage site on the surface of the dielectric will produce a higher k than the original low-k film. However, in instances where a minimal k value of the dielectric is not required, this rise in effective k resulting from non-carbon-containing repair (e.g., UV exposure alone) may be acceptable.

The UV light may be irradiated on the sidewalls and bottom of the trench to repair the damage from the etching of the trenches. The photon energy supplied by the UV treatment effectively lowers the activation barrier for reaction, and depleted methyl sites within the films are filled by a reaction with the active methyl groups derived from the gas phase source of methyl (—$CH_3$) groups. Satisfying the Si dangling bonds in the damaged film repairs the damage done to the low-k dielectric during the trench formation process (e.g., etching, ashing, and wet or dry cleaning) without substantially altering the dielectric properties. In addition, there may be silanol groups (—OH) in the damaged areas that are formed from Si dangling bonds that are exposed to moisture, either in subsequent processing or from moisture present in the fab ambient atmosphere. These silanol bonds are cleaved during the UV treatment, and the —OH groups leave the film, effectively lowering the dielectric constant and "repairing" the film. Interconnect reliability is thereby improved.

The dielectric film may be exposed to a UV source that produces UV radiation. The choices of UV wavelength(s), total exposure time and intensity, etc., depend on a number of factors, including the thickness of the dielectric film and the composition of the dielectric film. Suitable UV treatment parameters are in the power intensity range of about 1 mw-20 W/$cm^2$, preferably about 500 mW-5 W/$cm^2$; at a wavelength of about 150-500 nm, preferably about 200-400 nm; for up to about 20 minutes, for example less than 10 minutes, or less than 5 minutes, and preferably less than about 2 minutes; at a wafer temperature of between room temperature up to about 450° C., preferably about 200-400° C. A typical UV exposure in accordance with this aspect of the invention has a power density of about 1-3 W/$cm^2$ at a wafer temperature of about 350° C. in either inert (e.g., He, Ar, forming gas, or $N_2$) or oxidizing environments (e.g., in an anneal environment that comprises one or more of oxygen, ozone, peroxide or nitrous oxide). In oxidizing environments, oxygen can promote bond breaking thereby facilitating hydrogen removal for film repair. The UV source can be a single wavelength excimer lamp or broad spectrum source with arc or microwave excitations. The process pressure can range from about 1 mTorr to 760 Torr, preferably from about 1 Ton to 200 Torr. The UV exposure can also be achieved through direct exposure to a plasma of He, Ar, $N_2$, $NH_3$, $N_2O$, $O_2$, or a mixture of them.

Exposure time should be limited in order to prevent oxidation of or the stripping of methyl groups from the dielectric, or dielectric shrinking (which causes stress and strain in the film. In general, the dose time should be for no more than 10 seconds and/or result in a penetration of no more than four to five monolayers of the dielectric. A preferred dose time is about one to two seconds.

The apparatus employed to implement the invention can have one or more UV sources. In some embodiments described herein, the apparatus will have a single UV source. Suitable apparatus are described in more detail below.

The trenches may then be filled at 106 with a conductive material such as Cu. When filling the features, excess material will have to be removed from the top (exposed surface) of the dielectric layer. The excess material may be removed by a planarization process to form an exposed pattern of conductive features in the dielectric at 108. As discussed above, one widely-used planarization process is chemical mechanical polishing (CMP).

Particularly if the conductive layer includes copper, it is beneficial to remove oxides from the conductive layer after the planarization process at 110. As known by those of skill in the art, this step is typically accomplished by exposing the copper surfaces to a hydrogen or ammonia plasma. As discussed above, slurry from CMP can chemically remove carbon groups. The hydrogen/plasma used to remove the oxides can also strip carbon or hydroxyl groups from the film, leaving silicon dangling bonds on the surface of carbon-containing low-k dielectric film.

To repair the dangling bonds, the dielectric surface can be exposed to a second UV radiation treatment at 112. The treatment may be conducted under the same conditions as described above with reference to the post-trench etch treatment. The presence of the gas phase source of —$CH_3$ groups is optional. While the invention is not limited to this theory of operation, it is believed that the UV exposure of the surface removes the dangling bonds by cross-linking the surface Si groups to fill gaps from the departed methyl (—$CH_3$) groups and produces a densified surface layer. In some instances, the alteration of the surface dielectric properties of the carbon-containing low-k dielectric arising from the UV-induced surface cross-linking is acceptable.

In other instances, where the carbon-containing low-k surface properties are more critical, this surface UV exposure may optionally also be conducted in the presence of a gas phase source of —$CH_3$ groups such that the surface low-k dielectric repair is achieved without substantial alteration of dielectric properties, as described above.

Following the damascene processing with repair in accordance with the present invention, a diffusion barrier film, such as a copper diffusion barrier film, may be deposited on the planarized surface of the partially-formed semiconductor device. This layer may serve other purposes aside from that of a diffusion barrier. For example, the diffusion barrier film may also act as an etch stop layer.

Figure 2A:
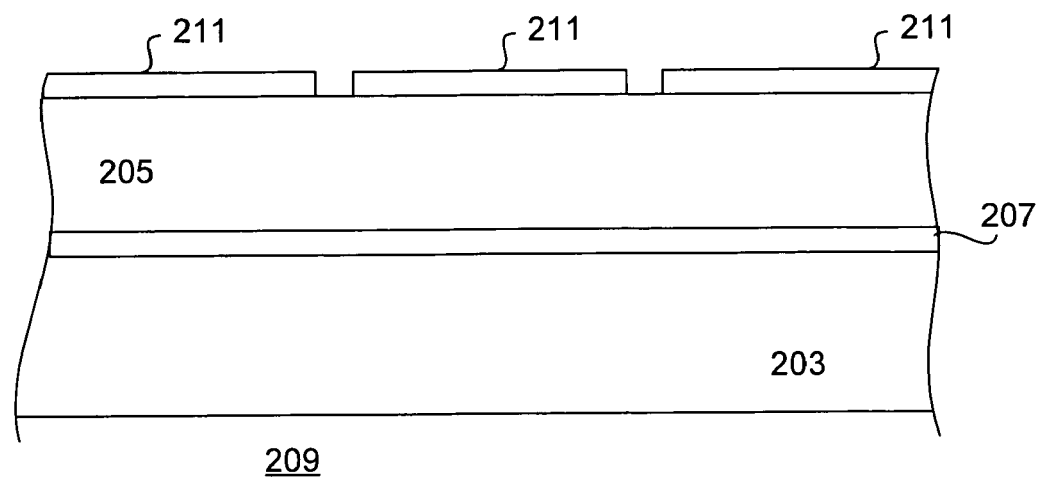
FIGS. 2A-2D are cross sectional diagrams illustrating the formation of a semiconductor device by a dual damascene process in accordance with an embodiment of the invention.

Referring now to FIGS. 2A-2D, a typical dual damascene process incorporating the carbon-containing low-k dielectric repair processes of the present invention are illustrated. First and second layers of dielectric are deposited in succession, possibly separated by deposition of an etch stop layer, such as a silicon nitride layer. These layers are depicted in FIG. 2A as first dielectric layer 203, second dielectric layer 205, and etch stop layer 207. As is well known in the art, according to alternative damascene processing techniques a single thicker dielectric layer can be used instead of discrete first and second layers.

Figure 2B:
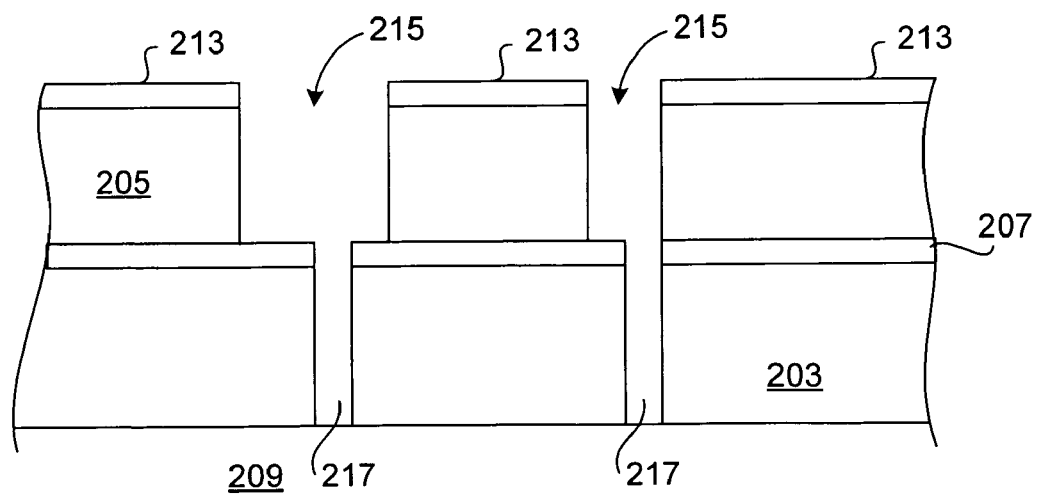
Figure 2C:
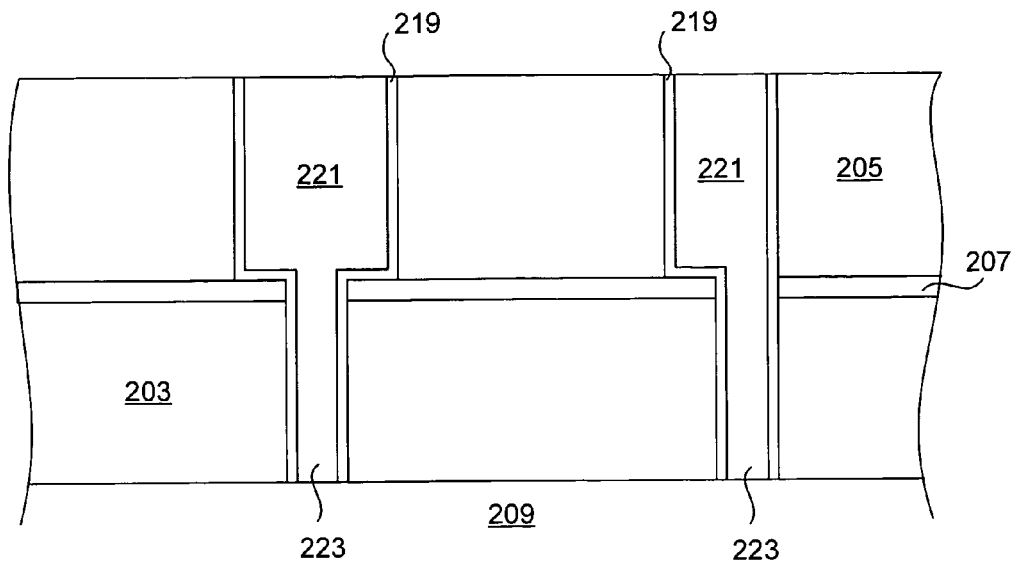
Figure 2D:
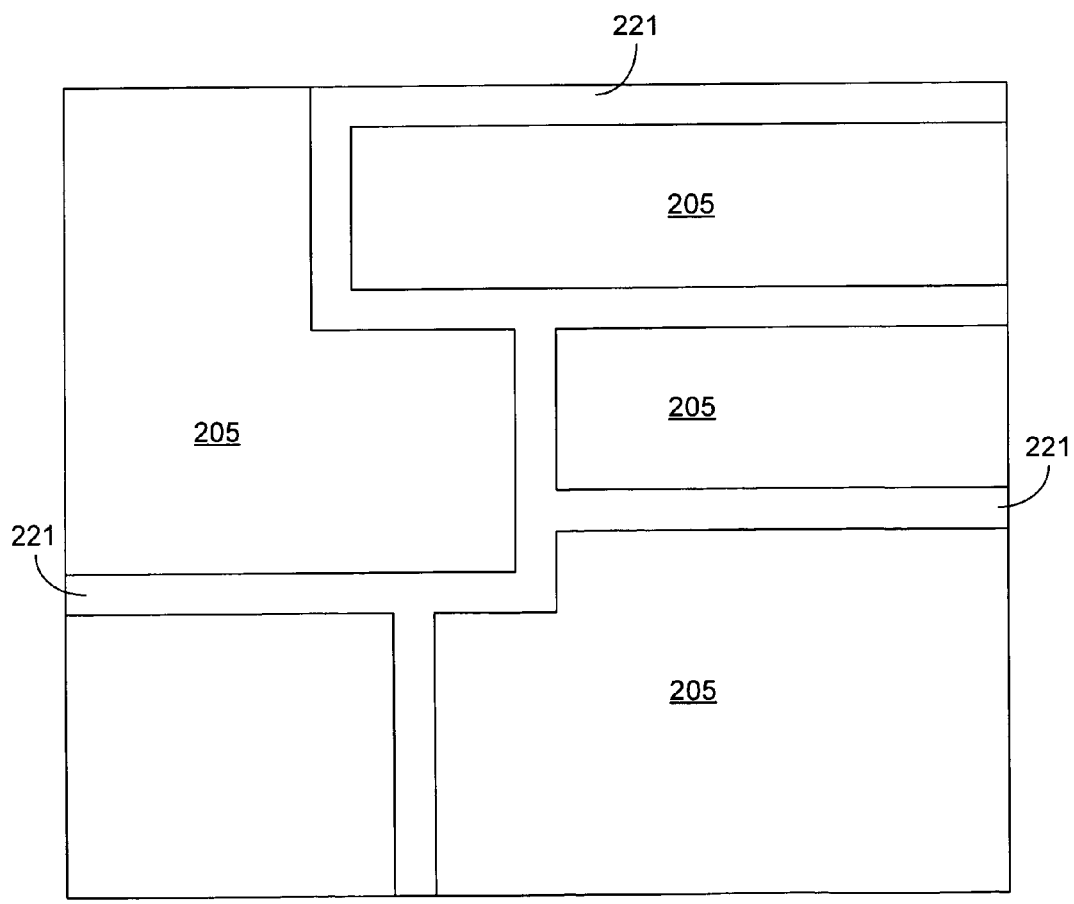

After deposition of the second dielectric layer 205, a via mask 211 is formed having openings where vias will be subsequently etched. Next, the vias are partially etched down through the level of etch stop 207. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact the underlying substrate 209.

It should be noted that the foregoing description is just an example of one dual damascene process with which the present invention may be implemented. One type of via first dual damascene process has been described. In other embodiments, a via first process may involve complete etching of the vias prior to etching of the line trenches. Or, a trench first process, in which the etching of the line trenches precedes the via etching, may be used. These various damascene processing techniques, and other variations thereon, are well know in the art and represent alternative implementation contexts for embodiments of the present invention. The invention is also applicable is single damascene processing, more conventional metal deposition and etch, and essentially any semiconductor processing context where carbon-containing low-k dielectrics are used.

Further in this regard, the term "trench" in the context of damascene processing is commonly understood to describe a feature formed in dielectric and subsequently filled to form a conductive line in a dielectric layer. In a more general semiconductor processing context, the term is also understood to describe a feature formed in dielectric and subsequently filled to form an element of a semiconductor device (e.g., via, line, STI, etc.), and may include a damascene trench, via or combined damascene structure. Unless it is otherwise clear from the context, when used herein, the term should be understood to have its broader meaning.

After etching the via hole and trenches, the photoresist is removed in another plasma process, followed by a wet or dry clean and then damage on the low-k dielectric surface is repaired, as discussed above.

Thereafter a thin layer of conductive barrier layer material 219 is formed on the exposed surfaces (including sidewalls) of dielectric layers 203 and 205. Conductive barrier layer material 219 may be formed, for example, of tantalum or tantalum nitride. A CVD or PVD operation is typically employed to deposit conductive barrier layer material 219. Prior to the deposition of the barrier material, a plasma process is typically used to clean the bottoms of the vias to remove oxidation and contaminants from the exposed copper surface on the underlying layer. As is known to those skilled in the art, this barrier "preclean" plasma process can be simply an inert plasma or a reactive plasma of a gas such as hydrogen. The preclean plasma process can also damage the low k dielectric film. An in-situ UV treatment to repair the damaged low k film may employed prior to the PVD operation- for Ta or TaN.

On top of the barrier layer, a conductive metal (typically copper) is deposited in the via holes and line paths 217 and 215. Conventionally this deposition is performed in two steps: an initial deposition of a conductive seed layer followed by bulk deposition of copper by electroplating. The seed layer may be deposited by physical vapor deposition, chemical vapor deposition, electroless plating, etc. Note that the bulk deposition of copper not only fills line paths 215 but, to ensure complete filling, also covers all the exposed regions on top of second dielectric layer 205.

Thus, it becomes necessary to planarize the structure and remove the excess copper from the device. Planarization removes material down to the level of the top of dielectric layer 205. This results in an exposed pattern of conductive lines 221 in dielectric layer 205 and vias in dielectric layer 203. (See the cross-sectional view of FIG. 2C and the simplified top view of FIG. 2D.)

Planarization may be accomplished by various techniques. Typically, the process involves some amount of CMP. It may also involve a combination of electropolishing, to remove most of the excess bulk copper, followed by CMP to remove the remaining copper down to the level of the top surface of dielectric layer 205. As discussed above, slurry from CMP can chemically remove carbon groups, and the hydrogen used to remove the oxides from the conductive layer after the planarization process can also remove carbon groups leaving silicon dangling bonds on the surface of low-k dielectric films.

Another aspect of the invention relates to post-planarization (e.g., CMP) damage repair arising in damascene processing. According to this aspect, following planarization by CMP, Si—OH (silanol) bonds (formed by removal of organic (generally —$CH_3$) groups by CMP slurry and processing and reaction of water in the slurry with resulting dangling Si-bonds), or other carbon-containing low-k dielectric film damage (e.g., highly strained bonds) are repaired by exposing the surface to UV radiation. As described above, it is believed that the UV exposure cross-links the film Si groups to fill gaps from the departed methyl (—$CH_3$) groups. The result is a densified surface layer. This UV exposure may optionally also be conducted in the presence of a gas phase source of -methyl (—$CH_3$) groups such that the surface low-k dielectric repair is achieved without substantial alteration of dielectric properties, as described above.

Apparatus

The present invention can be implemented in many different types of apparatus. In preferred embodiments, the apparatus will include one or more chambers (sometimes referred to as process vessels) that house one or more wafers and are suitable for wafer processing. At least one chamber will include a UV source. A single chamber may be employed for all operations of the invention or separate chambers may be used. Each chamber may house one or more wafers (substrates) for processing. The one or more chambers maintain the wafer in a defined position or positions (with or without motion within that position, e.g., rotation, vibration, or other agitation) during procedures of the invention. For certain operations in which the wafer temperature is to be controlled, the apparatus may include a heating or cooling platen.

Figure 3:
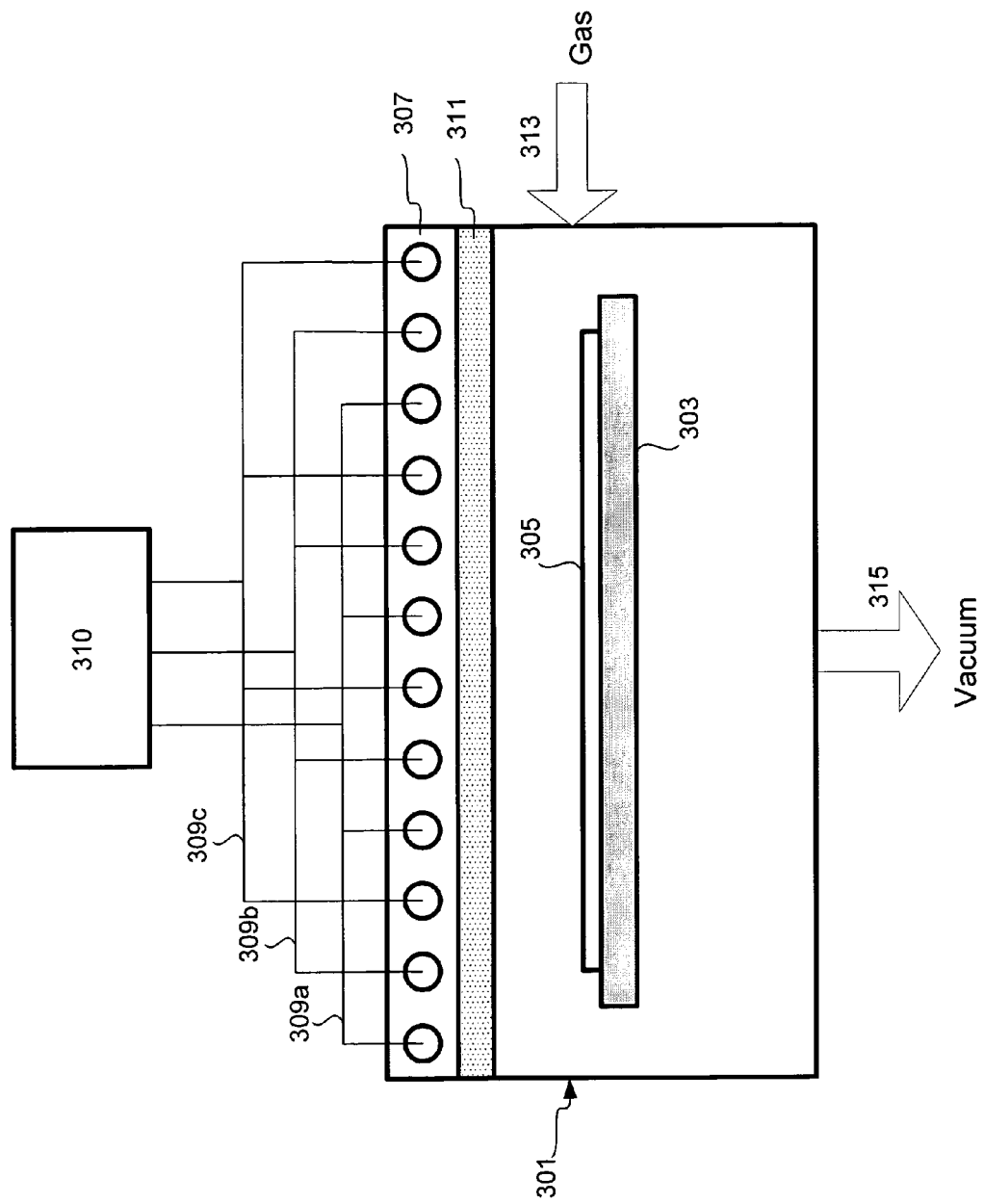
FIG. 3 is a schematic diagram of an example chamber suitable for implementing the present invention.

FIG. 3 is a schematic diagram of an example chamber 301 in accordance with the invention. Chamber 301 is capable of holding a vacuum and/or containing gases at pressures above atmospheric pressure. For simplicity, only one station of one chamber 301 is shown. It is noted that in preferred embodiments, chamber 301 is one chamber in a multi-chambered apparatus (entire apparatus not shown), although chamber 301 could alternatively be part of a stand-alone single chambered apparatus. In either case, the chamber(s) may have one or more than one station. Suitable single chamber, multi-station apparatus, for example, include the Novellus Sequel and Vector systems modified for UV treatments.

A substrate holder 303 secures a wafer 305 in a position such that light from a UV light source array 307 can irradiate wafer 305. Substrate holder 303 can have a heater (not shown) that can heat the substrate to defined temperatures, or could be cooled using a chiller and can be controlled by a temperature controller (not shown). Chamber 301 is configured with a gas inlet 315, which is connected to a gas source (not shown), and with a vacuum outlet 313, which is connected to a vacuum pump (not shown). The amount of gas introduced into the chamber 301 can be controlled by valves and mass flow controller (not shown) and pressure is measured by pressure gauge (not shown).

In this example, the UV light source array 307 is mounted outside the chamber 301. In alternate embodiments, the UV light source array may be housed inside the chamber 301. UV light source array 307 includes an array of individual UV sources such as mercury vapor or xenon lamps. Note that the invention is not limited to mercury vapor or xenon lamps as UV light sources and other suitable light sources include deuterium lamps, excimer lamps or lasers (e.g., excimer lasers and tunable variations of various lasers). Various optical elements, such as reflectors, may be required to direct the UV light toward portions of the substrate. Methods for directing the light at different portions of the substrate at different times may be required as well. A scanning mechanism may be used for this purpose. A window 311 made of quartz, sapphire or other suitable material is positioned between UV light source array 307 and wafer 305 to provide isolation. Filters can also be used to remove unwanted spectral components from particular sources to "tune" the sources.

The UV light source array 307 may be comprised of one or more types of UV sources, for example an array of three types of UV sources, each type providing UV radiation with a different wavelength distribution. The UV sources are electrically connected to each other (309a, 309b and 309c) and controlled by control system 310, which controls when each of the various UV sources is illuminated. Control system 310 is typically, but not limited to, a computer processing system such as a PC or workstation. Of course, any number and types of individual light sources in any suitable configuration can be used.

Note that the light source array and control configuration of FIG. 3 is only an example of a suitable configuration. In general, it is preferable that the lamps are arranged to provide uniform UV radiation to the wafer. For example, other suitable lamp arrangements can include circular lamps concentrically arranged or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as mirrors, lenses, diffusers and filters. The spectral distribution of individual sources can be controlled by the choice of sources (e.g., mercury vapor lamp vs. xenon lamp vs. deuterium lamp vs. excimer laser, etc.) as well as the use of filters that tailor the spectral distribution. In addition, the spectral distributions of some lamps can be tuned by doping the gas mixture in the lamp with particular dopants such as iron, gallium, etc.

It should be understood that the apparatus depicted in FIG. 3 is only an example of a suitable apparatus and that other designs for other methods involved in previous and/or subsequent processes may be used. Examples of apparatus that may be suitable for implementing the present invention are also described in commonly assigned co-pending application Ser. Nos. 11/115,576 filed Apr. 26, 2005, 10/800,377 filed Mar. 11, 2004 and 10/972,084 filed Oct. 22, 2004, incorporated by reference herein.

While the invention has been described primarily in the context of damascene processing, it may also be applicable in other semiconductor processing contexts.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A method of forming a semiconductor device in damascene processing, comprising:
   receiving in a processing chamber a semiconductor device substrate comprising a carbon-containing low-k dielectric layer having formed therein a trench, the trench having sidewalls and a bottom;
   exposing the sidewalls and bottom of the trench to UV radiation;
   whereby process induced low-k dielectric damage in the trench is repaired.

2. The method of claim 1, further comprising exposing the trench to a gas phase source of methyl (—$CH_3$) groups during the UV radiation.

3. The method of claim 2, wherein the gas phase source of —$CH_3$ groups generates active methyl species during the UV radiation.

4. The method of claim 2, wherein the UV radiation lowers activation energy for a reaction between the damaged dielectric in the trench and the gas phase source of —$CH_3$ groups.

5. The method of claim 2, wherein the gas phase source of —$CH_3$ groups comprises one or more selected from the group consisting of organo-silanes, -silazanes, and -siloxanes; acetaldehyde; alkanes; alkenes; and alkynes.

6. The method of claim 5, wherein the gas phase source of —$CH_3$ groups comprises one or more selected from the group consisting of dichlorodimethylsilane (DCDMS), chlorotrimethylsilane (CTMS), hexamethyldisilazane (HMDS), hexamethyldisiloxane (HMDSO), tetravinyltetramethylcyclotetrasiloxane (TVTMCTS), acetaldehyde, methane, ethane, ethylene, acetylene, and combinations thereof.

7. The method of claim 6, wherein the gas phase source of —$CH_3$ groups comprises one or more selected from the group consisting of dichlorodimethylsilane (DCDMS), chlorotrimethylsilane (CTMS), hexamethyldisilazane (HMDS), hexamethyldisiloxane (HMDSO), tetravinyltetramethylcyclotetrasiloxane (TVTMCTS), and combinations thereof.

8. The method of claim 5, wherein the gas phase source further comprises a source of H and —O groups.

9. The method of claim 5, wherein the gas phase source further comprises inert carrier gas.

10. The method of claim 1, wherein the UV radiation has a power density of about 500 mW-5 W/cm$^2$ and a wavelength from about 150-500 nm, and the exposure is conducted at a temperature of about room temperature up to 450° C. for less than 20 minutes.

11. The method of claim 1, wherein the UV radiation has a power density of about 1-3 W/cm$^2$ and a wavelength from about 200-400 nm, and the exposure is conducted at a temperature of about 200-400° C. for less than 5 minutes.

12. The method of claim 1, further comprising a further UV exposure of the device substrate following the trench repair, filling of the trench with a conductive material, and planarization of the of a top surface of the device substrate has been planarized such that both the low-k dielectric and the conductive material in the trench are exposed at the surface.

13. The method of claim 12, further comprising removing oxide from the conductive material.

14. The method of claim 12, wherein the conductive material is a metal.

15. The method of claim 12, further comprising exposing the planarized surface to a gas phase source of —$CH_3$ groups during the UV radiation exposure.

16. The method of claim 15, wherein the gas phase source of —$CH_3$ groups comprises one or more selected from the group consisting of organo-silanes, -silazanes, and -siloxanes; acetaldehyde; alkanes; alkenes; and alkynes.

17. The method of claim 16, wherein the gas phase source of —$CH_3$ groups comprises one or more selected from the group consisting of dichlorodimethylsilane (DCDMS), chlorotrimethylsilane (CTMS), hexamethyldisilazane (HMDS), hexamethyldisiloxane (HMDSO), tetravinyltetramethylcyclotetrasiloxane (TVTMCTS), acetaldehyde, methane, ethane, ethylene, acetylene, and combinations thereof.

18. The method of claim 17, wherein the gas phase source of —$CH_3$ groups comprises one or more selected from the group consisting of dichlorodimethylsilane (DCDMS), chlorotrimethylsilane (CTMS), hexamethyldisilazane (HMDS), hexamethyldisiloxane (HMDSO), tetravinyltetramethylcyclotetrasiloxane (TVTMCTS), and combinations thereof.

19. The method of claim 12, wherein the conductive material is copper.

20. The method of claim 12, wherein the UV radiation has a power density of about 500 mW-5 W/cm$^2$ and a wavelength from about 150-500 nm, and the exposure is conducted at a temperature of about room temperature up to 450° C. for less than 20 minutes.

21. The method of claim 12, wherein the UV radiation has a power density of about 1-3 W/cm$^2$ and a wavelength from about 200-400 nm, and the exposure is conducted at a temperature of about 200-400° C. for less than 5 minutes.

22. The method of claim 1, wherein the carbon-containing low-k dielectric comprises CDO.

* * * * *

UNITED STATES PATENT AND TRADEMARK OFFICE
CERTIFICATE OF CORRECTION

Page 1 of 1

PATENT NO.         : 7,851,232 B2
APPLICATION NO.    : 11/590661
DATED              : December 14, 2010
INVENTOR(S)        : Bart van Schravendijk et al.

It is certified that error appears in the above-identified patent and that said Letters Patent is hereby corrected as shown below:

CLAIMS:

1. In line 4 of claim 12 (column 12, line 21) delete "has been planarized".

Signed and Sealed this
Fourteenth Day of June, 2011

David J. Kappos
*Director of the United States Patent and Trademark Office*